US 6,263,228 B1

(12) United States Patent
Zhang et al.

(10) Patent No.: US 6,263,228 B1
(45) Date of Patent: Jul. 17, 2001

(54) METHOD AND APPARATUS FOR PROVIDING SEPARATE WATER-DOMINANT AND FAT-DOMINANT IMAGES FROM SINGLE SCAN SINGLE POINT DIXON MRI SEQUENCES

(75) Inventors: Weiguo Zhang, Foster City; David M. Kramer, Corte Madera; Andrew Li, South San Francisco, all of CA (US)

(73) Assignee: Toshiba America, MRI, Inc., Tustin, CA (US)

( * ) Notice: Subject to any disclaimer, the term of this patent is extended or adjusted under 35 U.S.C. 154(b) by 0 days.

(21) Appl. No.: 09/141,338

(22) Filed: Aug. 27, 1998

(51) Int. Cl.$^7$ ....................................................... A61B 5/05
(52) U.S. Cl. ........................ 600/409; 600/410; 128/899; 324/307; 324/309; 324/312; 324/300; 324/320
(58) Field of Search ..................................... 600/407, 409, 600/410; 128/653, 899; 324/307, 309, 312, 300, 320

(56) References Cited

U.S. PATENT DOCUMENTS

| | | | |
|---|---|---|---|
| 4,661,775 | * | 4/1987 | Kormos et al. ...................... 324/307 |
| 4,714,885 | | 12/1987 | Paltiel et al. . |
| 4,720,679 | * | 1/1988 | Patrick et al. ...................... 324/309 |
| 4,797,615 | | 1/1989 | Rotem et al. . |
| 4,823,085 | | 4/1989 | Fuderer et al. . |
| 4,833,408 | | 5/1989 | Yamamoto et al. . |
| 4,857,847 | | 8/1989 | Machida . |
| 4,902,973 | | 2/1990 | Keren . |
| 4,902,974 | | 2/1990 | Maeda et al. . |
| 4,949,042 | | 8/1990 | Kuhara et al. . |
| 5,084,818 | | 1/1992 | Machida . |
| 5,113,865 | | 5/1992 | Maeda et al. . |
| 5,144,235 | | 9/1992 | Glover et al. . |
| 5,256,967 | * | 10/1993 | Fool et al. ........................... 324/311 |
| 5,432,447 | | 7/1995 | Song . |
| 5,602,476 | * | 2/1997 | Liu et al. ............................. 324/309 |
| 5,642,047 | | 6/1997 | Bernstein . |
| 5,652,514 | | 7/1997 | Zhang et al. . |
| 5,701,074 | | 12/1997 | Zhu . |
| 5,909,119 | * | 6/1999 | Zhang et al. ........................ 324/309 |

* cited by examiner

Primary Examiner—Marvin M. Lateef
Assistant Examiner—Jeoyuh Lin
(74) Attorney, Agent, or Firm—Nixon & Vanderhye P.C.

(57) ABSTRACT

A method and apparatus for producing water-dominant and fat-dominant MR signal data for use in constructing separate images from single-scan single-point Dixon MRI sequences is disclosed. The effects of field inhomogeneities are removed by quantitating the signal phase by taking the argument of the MR signal multiplied by itself. A region-growing algorithm guided by a polynomial model is used to unwrap the phase which is then used to separately generate water-pixel data and fat-pixel data for producing separate images. The invention can be used for constructing images from both 2-D and 3-D spin-echo and/or field-echo acquisitions.

12 Claims, 5 Drawing Sheets

*Single Scan Single Point Dixon*
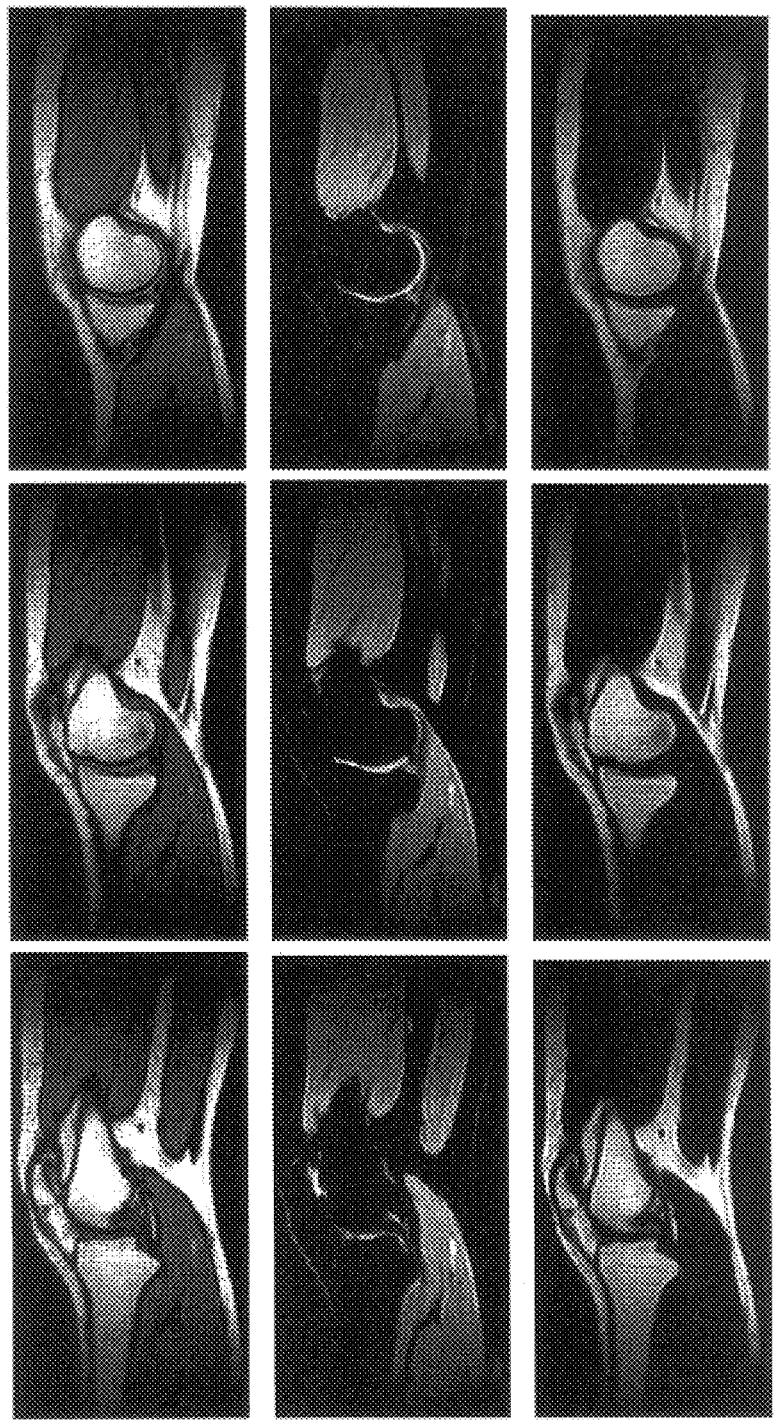
*Fig. 4(A)*  *Fig. 4(B)*  *Fig. 4(C)*
Spin-echo single scan single point Dixon images: (A) water fat out-of-phase images; (B) water pixels; (C) fat pixels.

*Single Scan Single Point Dixon*
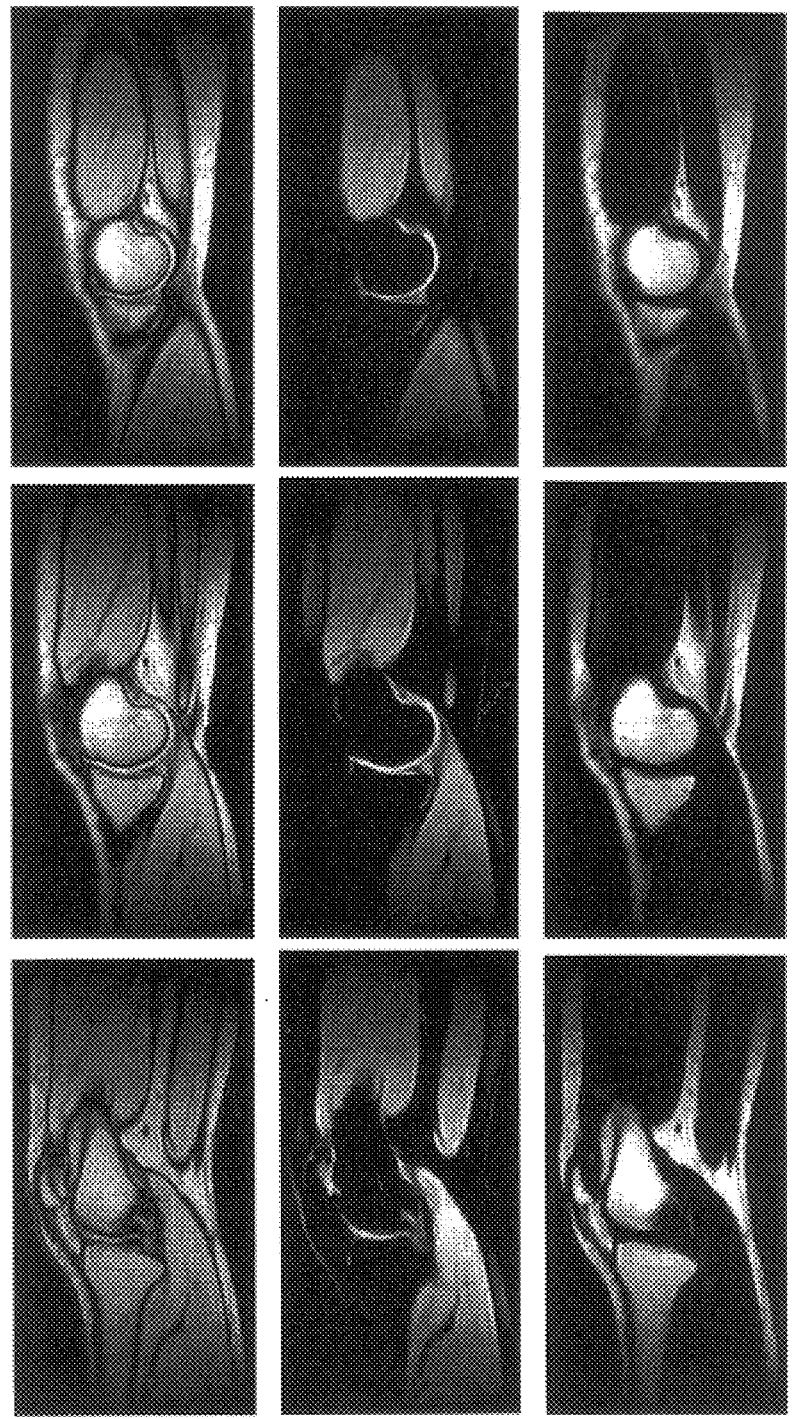
Fig. 5(A)     Fig. 5(B)     Fig. 5(C)
Field-echo single scan single point Dixon images: (A) water fat out-of-phase images; (B) water pixels; (C) fat pixels.

METHOD AND APPARATUS FOR PROVIDING SEPARATE WATER-DOMINANT AND FAT-DOMINANT IMAGES FROM SINGLE SCAN SINGLE POINT DIXON MRI SEQUENCES

FIELD OF THE INVENTION

This invention relates generally to magnetic resonance (MR) imaging (MRI) techniques. More particularly, it relates to methods for separating water and fat imaging information from single-scan single-point MRI Dixon sequences.

BACKGROUND OF THE INVENTION

Magnetic Resonance Imaging (MRI) has become a widely accepted and commercially available technique for obtaining digitized visual images representing the internal structure of objects (such as the human body) having substantial populations of atomic nuclei that are susceptible to nuclear magnetic resonance (NMR) phenomena. In MRI nuclei in a body to be imaged are polarized by imposing a strong main magnetic field Ho on the nuclei. Selected nuclei are excited by imposing a radio frequency (RF) signal at a particular NMR frequency. By spatially distributing the localized magnetic fields, and then suitably analyzing the resulting RF responses from the nuclei, a map or image of relative NMR responses as a function of the location of the nuclei can be determined. Following a Fourier analysis, data representing the NMR responses in space can be displayed on a CRT.

As shown in FIG. 1, the NMR imaging system typically includes a magnet 10 to impose the static magnetic field, gradient coils 12 for imposing spatially distributed magnetic fields in the three orthogonal coordinates, and RF coils 14 to transmit and receive RF signals to and from the selected nuclei. The NMR signal received by the coil 14 is transmitted to a computer 16 which processes the data into an image displayed on the display 18. The magnetic resonance image is composed of picture elements called "pixels." The intensity of a pixel is proportional to the NMR signal intensity of the contents of a corresponding volume element or "voxel" of the object being imaged. The computer 16 also controls the operation of the RF coils 14 and gradient coils 12 through the RF amplifier/detector 20 and gradient amplifiers 22, respectively.

Each voxel of an image of the human body contains one or more tissues. The tissues of the human body are comprised primarily of fat and water. Fat and water have many hydrogen atoms (the human body is approximately 63% hydrogen atoms). Since hydrogen nuclei have a readily discernible NMR signal, magnetic resonance imaging of the human body primarily images the NMR signal from the hydrogen nuclei.

In NMR, a strong static magnetic field is employed to align atoms whose nuclei have an odd number of protons and/or neutrons, such that the nuclei have a spin angular momentum and a magnetic dipole movement. A second RF magnetic field, applied as a single pulse transverse to the first field, pumps energy into the nuclei, which causes the angular orientation of the nuclei to flip by, for example, 90° or 180°. After this excitation, the nuclei precess and gradually relax into alignment with the static field. As they relax and precess, the nuclei emit energy in the form of weak but detectable free induction decay (FID). These FID signals and/or RF or magnetic gradient refocused "echoes" thereof (collectively referred to herein as MR signals) sensed by an NMR imaging system are used by a computer to produce images of the body.

The excitation frequency and the FID frequency are related by the Larmor relationship. This relationship states that the angular frequency, $\omega_0$, of the precession of the nuclei is the product of the magnetic field, $B_0$, and the so-called magnetogyric ratio, $\gamma$, a fundamental physical constant for each nuclear species:

$$\omega_0 = B_0 \cdot \gamma$$

By superimposing a linear gradient magnetic field, $B_z = Z \cdot G_z$ on the static uniform field, $B_0$, which is typically defined as the Z axis, for example, nuclei in a selected X-Y plane may be excited by proper choice of the frequency of the transverse excitation field applied along the X or Y axis. Similarly, a gradient magnetic field can be applied in the X-Y plane during detection of the MR signals to spatially localize emitted MR signals from the selected X-Y plane according to their frequency (and/or phase).

An example of an operation whereby the various coils produce the MR signal in a 3-D MRI is shown in FIG. 2A, which is a graphical representation of an example MRI acquisition sequence called a "field-echo" sequence. First, a gradient field, $G_{slice}$, is superimposed along the main field to sensitize a "slab" of nuclei in the body to be imaged to a particular RF resonance frequency. An RF "nutation" pulse is then applied at the particular frequency to force some of the nuclei within the slab to precess in a perpendicular direction with respect to the main field. Thereafter, pulsed magnetic gradient fields of changing magnitudes, $G_{pe}$ and $G_{slice}$, are used to phase encode the nuclei by inducing frequency differences, and hence phase differences, between nuclei in different locations along a direction within the slab. A gradient field applied perpendicular to the pe direction, in a "ro" (or "read out") direction, $G_{ro}$, first de-phases and then rephases the nuclei to form "field-echo" MR signals. During the field-echo, the applied gradient field, $G_{ro}$, frequency encodes the selected slab of nuclei in the readout direction. The resultant MR signal (also called "raw data" or "k-space data") is then read and analyzed by Fourier analysis. The frequency (domain) plot of that analysis is then scaled to render information about the nuclei population in Fourier space, which corresponds to an X-Y-Z position.

FIG. 2B shows another example of a 2-D MRI surface. In this case, a slice of nuclei are selected by a 90° followed by a 180° RF to generate a spin-echo. When the time between the 180°-center and the echo-center is the same as that between the 90°-center and the 180°-center, a symmetric spin-echo is generated. However, the echo-center can be shifted by adjusting the field gradients so that an asymmetric spin-echo is produced instead.

In addition to using the frequency information content of an MR signal to generate images, the phase of an MR signal in frequency domain can be utilized to provide information indicative of some physical quantity. For example, depending on the type of pulse sequence used, the MR phase can represent a main $B_0$ field inhomogeneity or can be proportional to the velocity of the moving spins.

As mentioned above, the main magnetic field can be altered by gradient magnetic fields created in the X, Y, and Z directions of the imaging volume. For the purpose of simplifying the descriptive mathematics, a rotating reference coordinate system X'-Y'-Z', that rotates at the nominal Larmor frequency about the Z' axis, is often used to describe nuclear phenomenon in NMR. Selected nuclei, which precess in alignment with the $B_0$ field, are influenced (nutated) by the perpendicular magnetic field of an RF pulse at the Lamor frequency, causing a population of such nuclei to tip from the direction of the magnetic field $B_0$. Thus, certain nuclei start aligned with the "Z'" axis by the static $B_0$ field and then are rotated to the X'-Y' plane as a result of the RF signal being imposed on them. The nuclei then precess in the X'-Y' plane.

The RF spin-nutating signal will, of course, tip more than one species of the target isotope in a particular area. For the purpose of simplifying the description in analyzing an MRI sequence, each RF pulse can be characterized by its center where nuclei can be considered all in-phase and whereafter each species of nuclei precess at their own characteristic speed. The phase of the processing nuclei species will gradually differ (de-phase) as a result of such parameters as the physical or chemical environment that the nuclei are located in. Nuclei in fat, for example, precess at a different rate than do nuclei in water due to their difference in chemical shift. Field gradients and inhomogenieties also contribute to this de-phasing.

MRI sequences are almost always designed to have the field gradients fully refocused at the echo-center, either by reversing the gradients to create field-echoes or by applying RF refocusing pulses to create spin-echoes. Inhomogeneities in the $B_0$ field and chemical shift are refocused in symmetric spin-echo, but not in field echoes and asymmetric spin-echoes.

Once the spins are disturbed from their equilibrium, processes known as relaxation cause the Z'-component to recover to its equilibrium magnitude, $M_0$, and the phase-coherent component of magnetic moments in the X'-Y' plane to decay. These processes are usually characterized by exponentials whose time constants are called the spin-lattice relaxation time, $T_1$, and the spin-spin relaxation time, $T_2$, respectively. When magnetic resonance signals are observed through magnetic flux oscillation in a plane coexistent with the X'-Y' plane, both of these processes cause the signal strength to decrease as a function of time. An apparent relaxation time, $T_2^*$, is used to characterize the transverse signal decay due to both the spin-spin relaxation and $B_0$ inhomogeneities.

A. Water and Fat Pixels

Although MR images of both water and fat may contain the same or different diagnostic information, they often interfere with each other's interpretation when overlapped in an MRI image, and thus make it difficult to properly interpret the composite MR image. The difference in one tissue versus another can be used as information to separate MRI images of fat component and tissue from fluids or water-based tissue (for these purposes, "water-based tissue" and "fluids" are used interchangeably).

When water and fat signals are separated quantitatively in each image pixel, the resultant images are called true water-only and fat-only images. A less vigorous approach is to separate the image into pixels which contain more water than fat (herein referred to as water pixels) and pixels which have more fat than water (herein referred to as fat pixels). Such separation may already be sufficient for certain kinds of diagnostic evaluations.

B. Three-Point Dixon Methods

At high-field strengths, the separation of water and fat images or suppression of one of these two components can be achieved using selective excitation or non-excitation approaches. However, at mid- or low-field strengths, approaches based on chemical shift selectivity become impractical, if not impossible. At all-field strengths, the difficulties of water/fat image separation are further exacerbated when there are large magnetic field inhomogeneities.

One promising group of techniques, known as "Three-Point Dixon" methods, have attractive features for mid- or low-field strength applications. These methods require three images to obtain enough information for water/fat separation with correction of the effect of $B_0$ field inhomogeneities. The Images can be acquired using spin-echo as well as field-echo sequences, in three separate scans as described in "Three-Point Dixon Technique for True-Water-Fat Decompositions with $B_0$ Inhomogeneity Corrected," by Glover et al., *Magnetic Resonance in Medicine* 18, 371–383 (1991); or in two scans, "Separation of True Fat and Water Images by Correcting Magnetic Field Inhomogeneity In Situ", by Yenng et al., *Radiology* 159, 783–786 (1986), or in a single scan, "True Water and Fat MR Imaging with Use of Multiple-Echo Acquisition", by William et al., *Radiology* 173, 249–253 (1989) and "Separation of Water and Fat MR Images in a Single Scan at 0.35 T Using 'Sandwich' Echoes," by Zhang et al, *JMRI* 6, 909–917 (1996), all the above of which are incorporated herein by reference.

In accordance with the above Three-Point Dixon method, acquisitions of the three images are controlled so that the difference in phase between the water image and the fat image changes by $\pi$ consecutively between three images. The image data may be represented as follows:

$$S_{-\pi}=(W-Fe^{-i\psi})e_0^{-i(\phi-\phi_o)}$$

$$S_0=(W+Fe^{-i\psi})e_0^{-i\phi_o}$$

$$S_\pi=(W-Fe^{i\psi})e_0^{-i(\phi+\phi_o)}$$

where $S_{-\pi}$, $S_0$ and $S_\pi$ represent the three MRI images; W and F are the water and fat components, respectively; $\psi$ is the difference in phase between the water and fat signals in $S_O$; $\phi_o$ is the phase in $S_O$ due to $B_0$-offset induced and other system sources; $\phi$ is the $B_0$-offset induced phase change between $S_{-\pi}$ and $S_O$ and between $S_O$ and $S_\pi$.

Images are then processed to obtain information to remove the effects of $B_0$ inhomogeneities and finally to separate the water and fat images: $B_0$ inhomogeneities are determined from the three images by a process of "phase unwrapping" as will be described further herein in greater detail:

$$\phi=\tfrac{1}{2}\text{ unwrap }\{\arg(S_\pi \cdot S_{-\pi})\}$$

where arg produces the phase angle of a complex number.

Water images and fat images can then be reconstructed in accordance with the following relationships:

$$W=S_O+0.5\, S_\pi e^{+i\phi}+0.5\, S_{-\pi}e^{-i\phi}$$

$$F=S_O-0.5\, S_\pi e^{i\phi}-0.5\, S_{-\pi}e^{-i\phi}$$

C. One-Point Dixon Methods

One-point Dixon methods, which form the subject matter of the present invention, acquire only one image in which the water and fat signals are out-of-phase, represented by:

$$S=(W-F)e^{i\phi}$$

Moreover only one image is available, attempts may still be made to determine the $B_0$ inhomogeneities by phase unwrapping before separating the water and fat pixels:

$$\phi=\tfrac{1}{2}\text{ unwrap }\{\arg(S \cdot S)\}$$

Water pixels ($I_{water-pixel}$) and fat pixels ($I_{fat-pixels}$) are then separated according to:

$$I_{water-pixel}=|s|+se^{i\phi}$$

$$I_{fat-pixel}=|s|-se^{i\phi}$$

D. Phase Unwrapping

Basically, phase unwrapping is a process of determining the absolute phase of a complex signal given the measurement of its principal phase value.

Since the phase angle of a complex number is unambiguous only between $-\pi$ and $\pi$, the phase of an MRI signal cannot be unambiguously determined from its argument. Any phase values beyond $-\pi$ and $\pi$ will be wrapped back around into values between $-\pi$ and $\pi$.

Preferred algorithms for phase unwrapping as implemented in the present invention involve a combination of modeling the static magnetic field using polynomial functions and a guided phase unwrapping by region-growing.

i. Polynomial Fitting

The magnetic field is modeled using a polynomial function:

$$B(x, y) = \sum_{n=1}^{3} [(a_n(x-x_o))^n + (b_n(y-y_o))^n] + c_o$$

To find the coefficients $a_n$ and $b_n$, partial spatial derivatives of the phase value $\phi$ are calculated and fit to polynomial functions as follows:

$$\frac{\partial \phi(x, y)}{\partial x} = p_3 x^2 + p_2 x + p_1$$

$$\frac{\partial \phi(x, y)}{\partial y} = q_3 y^2 + q_2 y + q_1$$

Fitting is performed using a weighted least-square with the weighting factors determined according to:

$$w(x, y) = \frac{S(x, y)}{S_{max}}$$

where $S(x,y)$ is the pixel value in the in-phase image and $S_{max}$ is the maximum of that image.

Using $p_n$ and $q_n$, $a_n$ and $b_n$ are calculated according to the following equations:

$$a_N \begin{cases} a_1 = p_1 + 2p_2 x_o + p_3 x_o^2 \\ a_2 = \frac{1}{2} p_2 + p_3 x_o \\ a_3 = \frac{1}{3} p_3 \end{cases}$$

$$b_N \begin{cases} b_1 = q_1 + 2q_2 y_o + q_3 y_o^2 \\ b_2 = \frac{1}{2} q_2 + q_3 y_o \\ b_3 = \frac{1}{3} q_3 \end{cases}$$

ii. Binary Phase Unwrapping

If it can be assumed that the magnetic field fitting is relatively accurate within a small error range, for example, $\pm 0.2\pi$, then unwrapping can be performed by simply comparing the measured phase (with the predicted phase $\phi_p$:

$$\Delta\phi = \phi_p - \phi$$

If $|\Delta\phi| > \pi$, then $\phi_f$ fused for water and fat image reconstruction is determined by $$\phi_f = \phi + \text{integer}\left(\frac{\Delta\phi}{2\pi}\right) \times 2\pi.$$

where integer promotes the resulting quotient to whole number.

iii. Unwrapping by Region Growing

However, the field fitting may contain large errors which will cause cumulative errors in phase-unwrapping and consequently result in water/fat mutual contamination in the final images. To unwrap in a more fool-proof way, a "region growing" algorithm is implemented as follows:

(a) A pixel in the image is chosen as the subseed for unwrapping and the measured phase value is assigned to the final phase value used for water and fat image reconstruction.

$$\phi_f(x_o, y_o) = \phi(x_o, y_o)$$

(b) The subseed is selected so that all pixels in a 6×6 region centered at the subseed have sufficient signal strength. The four immediately neighboring pixels of the subseed are first unwrapped by comparing the phase values to the subseed value. If the difference is larger than $$\phi_f = \phi + \text{sign}(\Delta\phi) \times 2\pi$$

a predetermined threshold, a 2T unwrapping is executed:

where: $\Delta\phi = \phi - \phi(x_0, y_0)$ (c) A 3×3 pixel region centered at the subseed is then built based on the five already-determined pixels. A $2\pi$ phase unwrapping is executed whenever the phase difference between a pixel and its already-unwrapped, immediate neighboring pixel is larger than the threshold.

(d) The 3×3 region is then expanded to 4×4 region with a three-pixel prediction:

$$\phi_p = \frac{1}{3}(\phi_f^{-3} + \phi_f^{-2} + \phi_f^{-1}) + \frac{1}{3}(3\Delta\phi^{-1} + 2\Delta\phi^{-2} + \Delta\phi^{-3})$$

where $\phi_p$ is the predicted phase value of a pixel; $\phi_f^{-i}$ (i=1, 2, 3) are the phase values of the already unwrapped first (i=1), second (i=2), and third (i=3) neighboring pixels; $\Delta\phi^{-i}$ are the phase spatial derivatives of the already-unwrapped, neighboring pixel along the direction of the prediction.

Unwrapping is executed if $\Delta\phi = \phi - \phi_p$ is larger than the threshold.

(e) Continuing from the 4×4 seed region, a four column by four rows "cross" region is built using a four-pixel prediction:

$$\phi_p = \frac{1}{4}(\phi_f^{-4} + \phi_f^{-3} + \phi_f^{-2} + \phi_f^{-1}) + \frac{1}{4}(\Delta\phi_f^{-3} + 3\Delta\phi_f^{-2} + 2\Delta\phi_f^{-3} + \Delta\phi_f^{-4})$$

(f) Using the cross, the four quadrants of the image are unwrapped using the same 4-pixel prediction approach, but in two directions. Unwrapping is executed when both directions show the same execution for unwrapping. In other situations, the average of the predicted values is used. When the pixel value is below the intensity threshold, the phase value is again set to the predicted average value.

SUMMARY OF THE INVENTION

The present invention provides a method and apparatus to acquire the information necessary for separating and producing water-pixel and fat-pixel NMR images, using a "single point" Dixon method in a single data acquisition scan. The present invention allows any MR imaging sequence, for example 2-D and 3-D field-echo or spin-echo sequences, that acquires k-space signals in which water nuclei and fat nuclei are out-of-phase to be used as a single scan single-point Dixon sequence to produce water-pixel and fat-pixel images. Phase unwrapping is also employed in the present invention in analyzing single-scan single-point Dixon images to produce water-pixel and fat-pixel images.

While a "Sandwich" spin-echo method, as described in the above-mentioned commonly-assigned, co-pending patent application by Zhang et al., produces truly water and fat separated images, the single point Dixon method of the present invention produces "water-pixel" and "fat-pixel" images. A water-pixel is a pixel that is water signal dominant, as opposed to a "pure" water signal pixel. A "fat-pixel" is a pixel that is fat signal dominant, as opposed to a "pure" fat signal pixel.

In accordance with a preferred embodiment of the present invention, the effects of field inhomogeneities and chemical shift are removed from an MR signal in which the water and fat signals are out-of-phase by first quantitating the signal phase by taking the argument of the complex signal multiplied by itself. The argument is the mathematical operation that returns the independent variable of a function—in this case the phase of the detected MR signal. Next, a region-growing algorithm (see background discussion) guided by a polynomial model is used to unwrap the phase which is then used to separately calculate water-pixel data and fat-pixel data for producing separate images. The salient steps of this method as presently preferred in the present invention are illustrated by the flowchart of FIG. 3.

In contrast to the "Sandwich" spin-echo method, the single-scan single-point Dixon method of the present invention requires no sacrifice in sequence performance This is of particular significance for 3-D acquisition or fast imaging applications because a much shorter TR (sequence repetition time) can be used to reduce the scan time. Moreover, since no reversal of the readout gradient is involved, the single point Dixon method is free from the geometrical distortion artifacts inherent to the "Sandwich" spin-echo method.

The method of the present invention as briefly summarized above is applicable to 3-D multiple-slab as well as 2-D multiple-slice data imaging.

BRIEF DESCRIPTION OF THE DRAWINGS

The purpose and advantages gained by the present invention will be understood by careful study of the following detailed description of the presently preferred embodiment with particular reference to the accompanying drawings.

FIGS. 4(a)–(c) comprise example spin-echo single-scan single-point Dixon MRI images showing (a) water-fat out-of-phase images, (b) water-pixel images and (c) fat-pixel images produced in accordance with the present invention; and FIGS. 5(a)–(c) comprise example field-echo single-scan single-point Dixon MRI images showing (a) water-fat out-of-phase images, (b) water-pixel images and (c) fat-pixel images produced in accordance with the present invention.

DETAILED DESCRIPTION OF THE PRESENTLY PREFERRED EMBODIMENT

As is well-known, nuclei precess at a particular frequency with a particular phase. By applying gradient fields to the nuclei in different orthogonal directions, the frequency and phase of the precessions can be used to spatially encode the nuclei. In one orthogonal direction, a "slice" of nuclei are excited. Within that slice, MR signals are extracted from the remaining two dimensions of the slice, using the frequency of precession of the selected nuclei to spatially encode the nuclei in one direction and using the phase of precession of the selected nuclei to spatially encode the nuclei in the second (or other) direction(s). By analyzing the complex frequency and phase of the resultant MR signal, information about the nuclei density in the selected slice can be determined.

Figure 1:
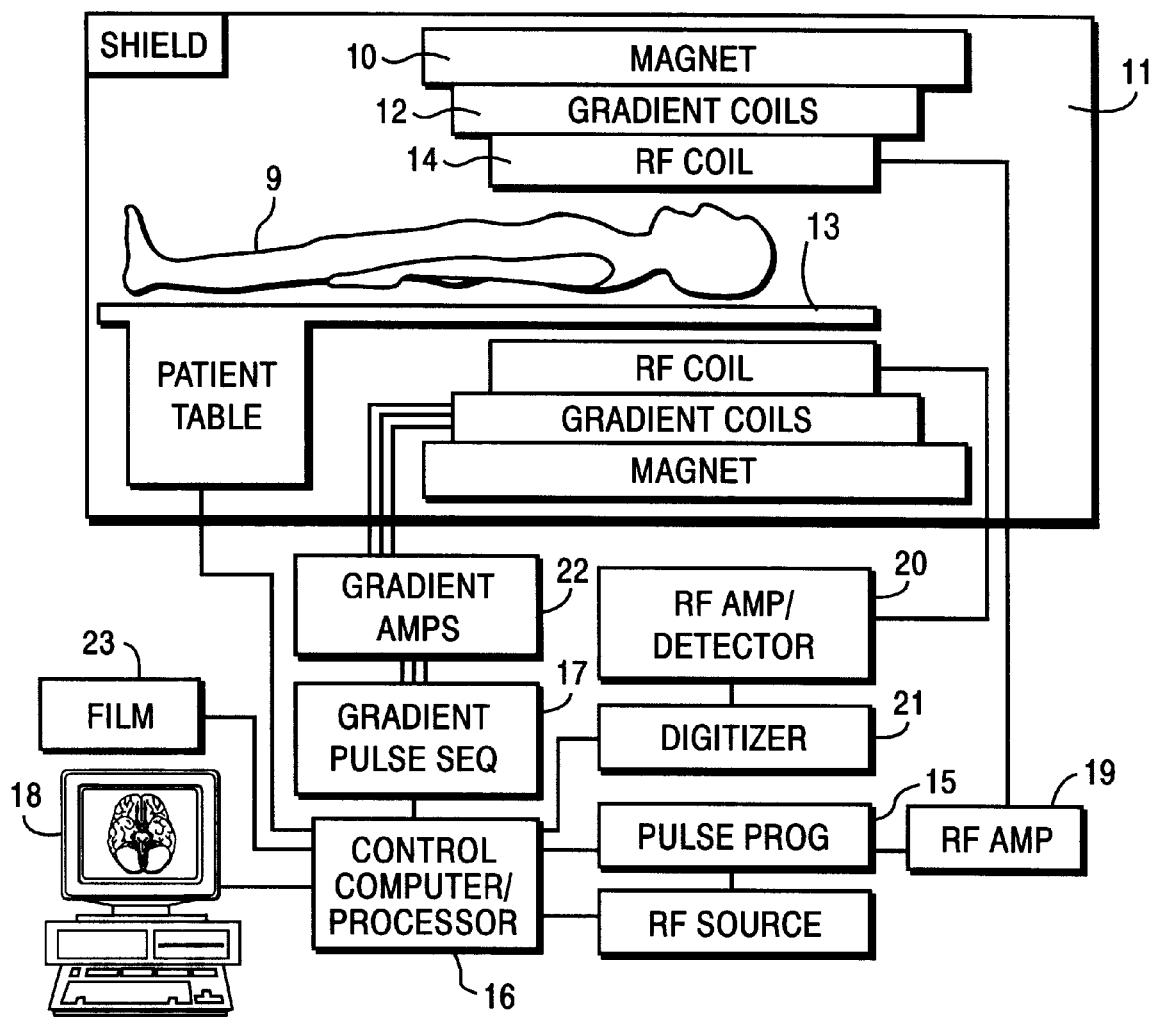
FIG. 1 is a schematic diagram of an MRI system.

FIG. 1 depicts an MRI system. One example of such a system is the Toshiba OPART™ MRN system. For example, the MRI system may comprise a large polarizing magnet structure 10 which generates a substantially uniform homogeneous polarizing magnetic field $B_0$ within a patient imaging volume 11. A suitable carriage 13 inserts the desired portion of patient 9 anatomy within the image volume 11. Magnetic gradients in $B_0$ are selectively created by electromagnetic gradient coils. RF nuclei nutation pulses are transmitted into the patient tissue within the image volume. The RF responses constituting the MR signal are received from the patient tissue via suitable RF coil structures.

To acquire MRI data, the MRI system generates magnetic gradient and RF nutation pulses under the control of MRI pulse sequence controllers 15 and 17. In addition, processor 16 controls the gradient pulse amplification drivers 22 and RF amplifier circuits 19. RF amplifier 19 and MR signal RF receiver circuits 20 are suitably interfaced with electromagnetic and RF coils within the MRI system gantry. The received MR responses are digitis y digitizer 21 and passed to an MRI image processor 16 which typically includes an array processor (not shown) and suitable computer program storage media (e.g., silicon or magnetic media) wherein programs are stored and selectively utilized so as to control the processing of acquired MR signal data to produce digitized image displays on a CRT of control terminal 18. Images may also be directly recorded on film 23 by computer/processor 16 and control terminal 18 may also include suitable keyboard switches and the like for exerting operator control over the MRJ sequence controllers 15, 17 and the interconnected cooperating MR image processor 16.

In conjunction with the usual MRI processor 16, an operator is typically presented with a menu of choices. In the exemplary embodiment of this invention, one of those choices available to the operator is a program for generating separate water-pixel and fat-pixel MRI images by obtaining the requisite single-scan single-point Dixon MR signal data and then generating and/or displaying: (a) a fat-pixel image, or (b) a water-pixel image of the measured NMR nuclei. The generation of a suitable detailed computer program for effecting the described process of the present invention is believed to be well within the ability of those skilled in this art in view of the flowchart of FIG. 3 in conjunction with the totality of the disclosure herein.

Figure 2A:
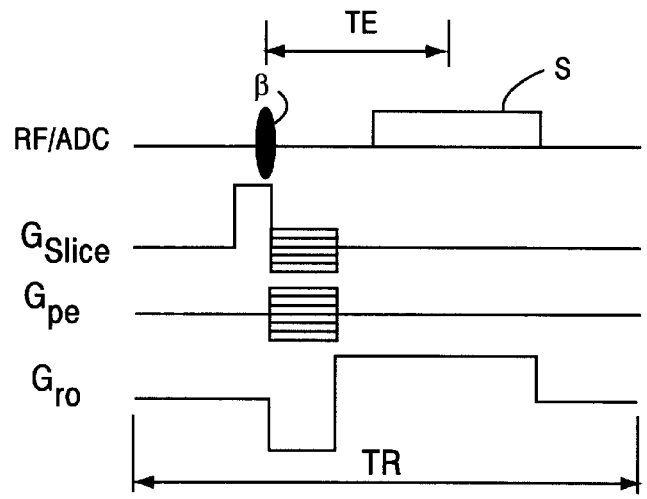
FIG. 2(a) is a diagram of an example 3-D field-echo pulse sequence for MRI.
Figure 2B:
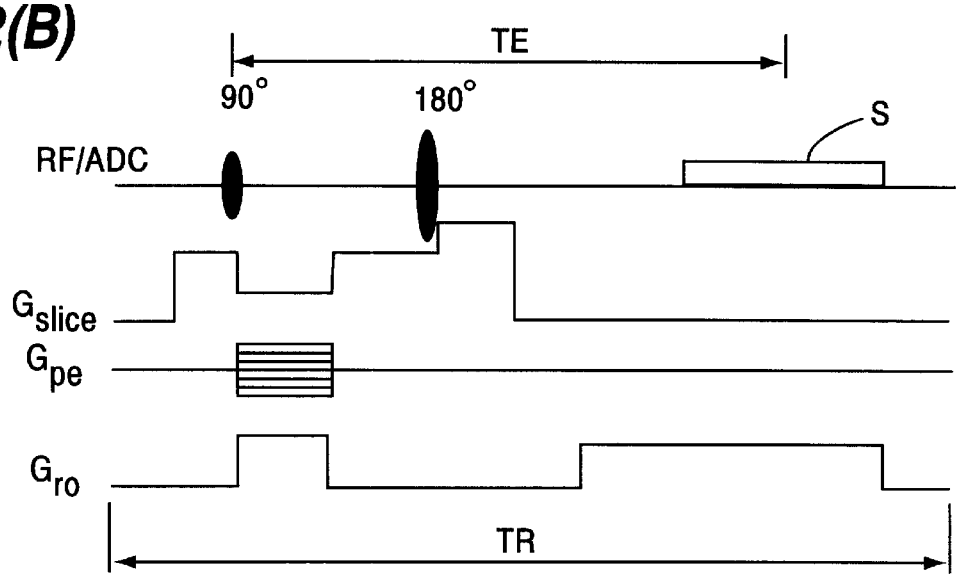
FIG. 2(b) is a diagram of an example spin-echo pulse sequence for MRI.

FIGS. 2(a) and 2(b) illustrate typical MRI acquisition sequences for field-echo and spin-echo single-scan single-point Dixon sequences, respectively. Referring first to FIG.

2(a), in a field-echo sequence an MR signal, S, is obtained after an echo time (TE) following transmission an RF excitation (mutating) pulse. TE is controlled so that the water and fat signals are out-of-phase at the echo-center. At 0.35 T, this constrains the TE to odd multiples of about 9.5 ms, (i.e., 9.5, 28.5 . . . , ms). The repetition time (TR) between adjacent excitation pulses is also illustrated. The transmitted excitation pulse, β, nutates the selected nuclei in a slab identified by the gradient magnetic field, $G_{slice}$. Changing gradient fields, $G_{pe}$ and $G_{slice}$, phase encode the nuclei within the selected slab. The third gradient magnetic field, $G_{ro}$, frequency encodes the nuclei in the slice selection, resulting in the MR signal S. The sequence repeats with another excitation pulse signal TX.

In FIG. 2(b) the events forming a 2-D spin-echo sequence are similarly depicted. In this sequence, an RF transmission pulse occurs twice at different times and magnitudes causing a 90° nutation followed by a 180° "refocusing" rotation of the nuclei. The resulting echo-center of echo-signal S is shifted from the true spin-echo position by an amount as previously disclosed so that the water and fat signals are out-of-phase at the echo-center.

Figure 3:
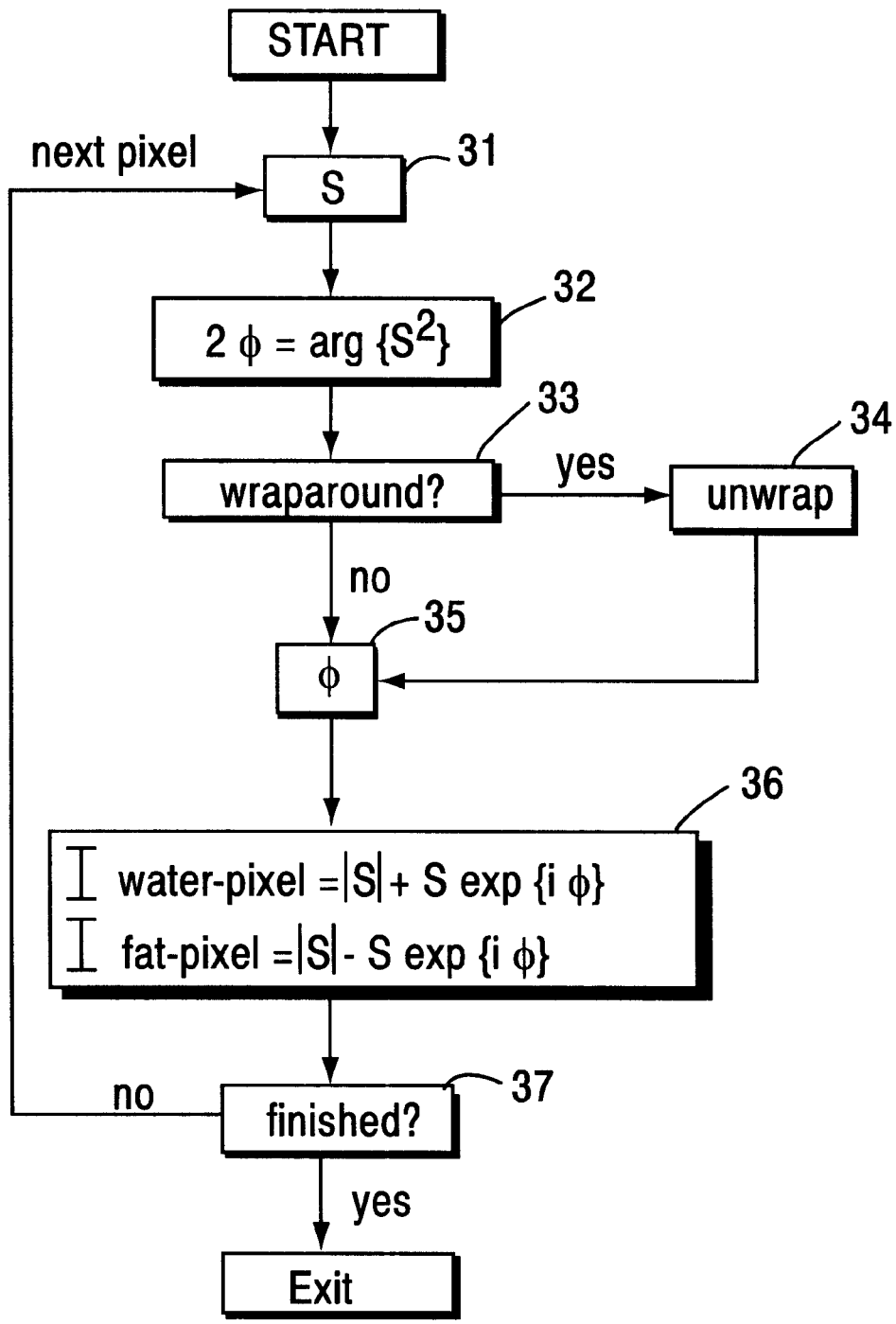
FIG. 3 is a flowchart illustrating the processes carried out by the MRI system of FIG. 1 in accordance with the present invention.

Referring now to FIG. 3, a flow diagram is presented that illustrates the steps for producing water-dominant and fat-dominant MR signal data for use in constructing separate images from single-scan single-point Dixon MRI sequences. These steps are implemented by MIU system control processor 16 (or an associated computer/processor) programmed in a manner familiar to one in the art to analyze the acquired MR signal data.

First, with reference to step 31, the MR signal from a single-scan single-point Dixon acquisition sequence comprising mixed water/fat out-of-phase information is obtained and fourier transformed. These fourier transformed mixed MR signals, S, are represented in the image (frequency) domain by the following equation:

$$S=(W-F)e^{-i\phi}$$

where W and F are water and fat signals, respectively, and φ is the signal phase due to field inhomogeneities and other system effects.

In step 32, the signal phase, φ, is quantitated by taking the argument of the complex image domain, (i.e., after fourier analysis) MR signal, S, multiplied by itself. This step also eliminates chemical shift effects. In mathematical terms:

$$2\phi=\arg\{S^2\}$$

where arg { } is an operation that returns the phase of the input signal.

In step 33, a determination is made as to whether phase unwrapping is required. In step 34, a region-growing algorithm guided by a polynomial model is used to unwrap the phase (since the signal is unambiguous only between −π and +π).

Once the unwrapped phase φ is obtained, as indicated in step 35, the water-pixel, $I_{water-pixel}$, and fat-pixel, $I_{fat-pixel}$, imaging data is calculated by MRI system processor 16, as indicated at step 36, in accordance with the following two equations:

$$I_{water-pixel}=|S|+S\exp\{i\phi\} \quad \text{Equ. 1}$$

$$I_{fat-pixel}=|S|-S\exp\{i\phi\} \quad \text{Equ. 2}$$

Finally, as indicated in step 36, the process is continued for all of the acquired MR scan data until all pixel data acquired in the scan has been processed. The water-pixel and fat-pixel image data is then used to produce an image on film or for display on CRT 18 in the conventional manner.

FIGS. 4(a)–(c) show examples of spin-echo single-scan single-point Dixon MRJ images comparing water/fat out-of-phase images 4(a) with water-pixel images 4(b) and fat-pixel images 4(c) produced in accordance with the present invention.

FIGS. 5(a)–(c) show examples of field-echo single-scan single-point Dixon MRI images comparing water/fat out-of-phase images 5(a) with water-pixel images 5(b) and fat-pixel images 5(c) produced in accordance with the present invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of obtaining $B_0$ inhomogeneity and chemical-shift corrected fat-signal dominant NMR imaging data and water-signal dominant NMR imaging data from MRI k-space data, in which water nuclei and fat nuclei are out of phase, comprising the steps of:

(a) fourier transforming an acquired NMR k-space data signal to obtain a complex image domain signal, S, comprising mixed water/fat out-of-phase information, wherein the acquired NMR k-space data signal is acquired from a single data acquisition scan having MRI pulse sequences which produce a single echo per sequence;

(b) generating a value representing a square of the image domain signal S;

(c) generating a phase argument comprising the square of the image domain signal, S, and determining phase value information, φ, for the image domain signal, S, according to a relationship:

$$2\phi=\arg\{S^2\};$$

(d) unwrapping phase value information determined in step (c) in accordance with a region-growing phase unwrapping method guided by a polynomial model; and (e) generating water-dominant pixel image data, $I_{water-pixel}$, and fat-dominant pixel image data, $I_{fat-pixel}$, using phase value information determined in step (d) according to two relationships as follows:

$$I_{water-pixel}=|S|+S\exp\{i\phi\} \text{ and } I_{fat-pixel}=|S|-S\exp\{i\phi\}.$$

2. The method of claim 1 wherein the k-space data is acquired from a single-scan single-point Dixon MRI sequence.

3. An apparatus for obtaining $B_0$ inhomogeneity and chemical-shift corrected fat-signal dominant NMR imaging data and water-signal dominant NMR imaging data from MRI sequence raw data, in which water nuclei and fat nuclei are out of phase, comprising:

means for acquiring NMR raw data from a single image acquisition scan in which MRI pulse sequences produce a single echo per sequence;

means for performing fourier analysis on an acquired NMR raw data signal to obtain a complex image domain signal, S, comprising mixed water/fat out-of-phase information;

means for generating a value representing a square of image domain signal S after Fourier analysis;

means for generating a phase argument of the square of the signal, S, and determining phase, φ, for the NMR signal, S, according to a relationship:

$$2\phi\mathrel{+}=\arg\{S^2\};$$

means for unwrapping the phase in accordance with a region-growing phase unwrapping method guided by a polynomial model; and means for generating water-dominant pixel image data, $I_{water\text{-}pixel}$, and fat-dominant pixel image data, $I_{fat\text{-}pixel}$, according to two relationships as follows:

$$I_{water\text{-}pixel}=|S|+S\exp\{i\phi\} \text{ and } I_{fat\text{-}pixel}=|S|-S\exp\{i\phi\}.$$

4. The apparatus of claim 3 wherein the raw data is acquired from a single-scan single-point Dixon MRI sequence.

5. An apparatus for developing $B_0$ inhomogeneity and chemical-shift corrected fat-signal dominant NMR image data and water-signal dominant NMR image data from raw k-space data acquired from a single image acquisition scan in which MI pulse sequences produce a single echo per sequence and in which data water nuclei and fat nuclei are out of phase, said apparatus comprising a computer including a storage memory and I/O devices, said memory having stored therein rules and/or instructions for performing NMR signal analysis, said computer programmed to:

generate a value for a square of a fourier transformed frequency domain NMR signal S;

generate a phase argument of the square of the NMR signal, S, and determining phase value information, φ, for the NMR signal, S, according to a relationship:

$$2\phi=\arg\{S^2\};$$

unwrap phase value information in accordance with a region-growing phase unwrapping method guided by a polynomial model; and generate water-dominant NMR pixel image data, $I_{water\text{-}pixels}$ and fat-dominant NMR pixel image data, $I_{fat\text{-}pixel}$, according to two relationships as follows:

$$I_{water\text{-}pixel}=|S|+S\exp\{i\phi\} \text{ and } I_{fat\text{-}pixel}=|S|-S\exp\{i\phi\}.$$

6. The apparatus of claim 5 wherein the k-space data is acquired from a single-scan single-point Dixon MRI sequence.

7. In an MRI system, a computer for analyzing MRI image data acquired from a single image acquisition scan in which MRI pulse sequences produce a single echo per sequence, said computer comprising a processor including a storage memory and I/O devices, said memory having stored therein rules and/or instructions for performing frequency domain NMR signal analysis, said processor programmed to:

generate a value for a square of a fourier transformed complex MRI echo signal, S;

generate a phase argument of the square of signal S and determine phase value information, φ, for signal S according to a relationship:

$$2\phi=\arg\{S^2\};$$

unwrap the phase value information in accordance with a region-growing phase unwrapping algorithm guided by a polynomial model; and generate water-signal dominant NMR pixel image data, $I_{water\text{-}pixel}$, and fat-signal dominant NMR pixel image data, $I_{fat\text{-}pixel}$, according to two equations as follows:

$$I_{water\text{-}pixel}=|S|+S\exp\{i\phi\} \text{ and } I_{fatpixel}=|S|-S\exp\{i\phi\};$$

wherein said MRI system develops $B_0$ inhomogeneity and chemical-shift corrected fat-signal dominant NMR image data and water-signal dominant NMR image data after fourier analysis from acquired MRI sequence k-space data in which water nuclei and fat nuclei are out-of-phase.

8. The MRI system of claim 7 wherein the k-space data is acquired using a single-scan single-point Dixon MRI sequence.

9. The MRI system of claim 7 wherein the k-space data is acquired using an MRI field-echo sequence.

10. The MRI system of claim 7 wherein the k-space data is acquired using an MRI spin-echo sequence.

11. The MRI system of claim 7 wherein the k-space data is acquired using a fast imaging MRI pulse sequence.

12. The method of claim 1 wherein the k-space data is acquired by using a single-scan single-point Dixon NMR sequence.

* * * * *